(12) United States Patent
Chang et al.

(10) Patent No.: US 8,022,458 B2
(45) Date of Patent: Sep. 20, 2011

(54) CAPACITORS INTEGRATED WITH METAL GATE FORMATION

(75) Inventors: Chung-Long Chang, Dou-Liu (TW); David Ding-Chung Lu, Hsin-Chu (TW); Chia-Yi Chen, Hsin-Chu (TW); I-Lu Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 512 days.

(21) Appl. No.: 11/868,856

(22) Filed: Oct. 8, 2007

(65) Prior Publication Data
US 2009/0090951 A1    Apr. 9, 2009

(51) Int. Cl.
*H01L 27/108* (2006.01)
(52) U.S. Cl. .......... 257/307; 257/306; 438/399
(58) Field of Classification Search .......... 257/307, 257/306; 438/399
See application file for complete search history.

(56) References Cited

U.S. PATENT DOCUMENTS

| | | |
|---|---|---|
| 4,954,927 A | 9/1990 | Park |
| 5,304,506 A | 4/1994 | Porter et al. |
| 5,939,766 A | 8/1999 | Stolmeijer et al. |
| 6,103,621 A | 8/2000 | Huang |
| 6,104,053 A * | 8/2000 | Nagai .......... 257/303 |
| 6,306,721 B1 | 10/2001 | Teo et al. |
| 6,383,858 B1 | 5/2002 | Gupta et al. |
| 6,653,681 B2 | 11/2003 | Appel |
| 6,730,581 B2 | 5/2004 | Suguro |
| 6,743,671 B2 | 6/2004 | Hu et al. |
| 6,819,542 B2 | 11/2004 | Tsai et al. |
| 7,126,809 B2 | 10/2006 | Iioka et al. |
| 7,209,340 B2 | 4/2007 | Iioka et al. |
| 7,276,776 B2 | 10/2007 | Okuda et al. |
| 7,554,117 B2 | 6/2009 | Nakamura |
| 2002/0094643 A1 | 7/2002 | Solomon et al. |
| 2002/0195669 A1 * | 12/2002 | Morihara et al. .......... 257/390 |
| 2003/0036244 A1 | 2/2003 | Jones et al. |
| 2003/0183864 A1 | 10/2003 | Miyazawa |
| 2004/0140487 A1 | 7/2004 | Furumiya et al. |
| 2006/0006496 A1 | 1/2006 | Harris et al. |
| 2007/0296013 A1 | 12/2007 | Chang et al. |
| 2009/0325376 A1 | 12/2009 | Nakamura |

FOREIGN PATENT DOCUMENTS

| | | |
|---|---|---|
| CN | 1765009 A | 4/2006 |
| CN | 1835235 A | 9/2006 |

* cited by examiner

*Primary Examiner* — Samuel A Gebremariam
(74) *Attorney, Agent, or Firm* — Slater & Matsil, L.L.P.

(57) ABSTRACT

A semiconductor structure including a capacitor having increased capacitance and improved electrical performance is provided. The semiconductor structure includes a substrate; and a capacitor over the substrate. The capacitor includes a first layer including a first capacitor electrode and a second capacitor electrode, wherein the first capacitor electrode is formed of a metal-containing material and is free from polysilicon. The semiconductor structure further includes a MOS device including a gate dielectric over the substrate; and a metal-containing gate electrode on the gate dielectric, wherein the metal-containing gate electrode is formed of a same material, and has a same thickness, as the first capacitor electrode.

14 Claims, 19 Drawing Sheets

CAPACITORS INTEGRATED WITH METAL GATE FORMATION

TECHNICAL FIELD

This invention relates generally to semiconductor devices, and more particularly to layout design and manufacturing methods of metal-oxide-metal capacitors.

BACKGROUND

Metal-insulator-metal (MIM) capacitors and metal-oxide-metal (MOM) capacitors are among the most widely used capacitors in integrated circuits. FIG. 1 illustrates a typical MIM capacitor, which includes bottom plate 2, top plate 6, and insulation layer 4 therebetween. The bottom plate 2 and top plate 6 are formed of conductive materials.

As is known in the art, the capacitance of a capacitor is proportional to its area and the dielectric constant (k) of the insulation layer, and is inversely proportional to the thickness of the insulation layer. Therefore, to increase the capacitance, it is preferable to increase the area and the k value and to reduce the thickness of the insulation layer. However, the thickness and the k value are often limited by the technology used for forming the capacitor. For example, the thickness cannot be less than what the existing technology allows. On the other hand, since the capacitors are often formed in low-k dielectric layers, the ability to increase the k value is also limited.

Methods for increasing the area of the capacitor have been explored. A problem associated with increasing area is that greater chip area is required. This dilemma is solved by the introduction of vertical (multi-layer) capacitors. A typical vertical MOM capacitor 10 is shown in FIGS. 2, 3, and 4. FIG. 2 illustrates a perspective view of MOM capacitor 10, which includes metal electrodes 12 and 14 separated by dielectric materials. Each of the metal electrodes 12 and 14 forms a three-dimensional structure. For clarity, metal electrode 12 is not shaded, while metal electrode 14 is shaded with dots.

Each of the metal electrodes 12 and 14 includes more than one layer interconnected by vias. FIG. 3 illustrates a top view of a first metal layer (please refer to the middle layer in FIG. 2). Metal electrode 12 includes fingers $12_2$, and bus $12_1$ for interconnecting fingers $12_2$. Metal electrode 14 includes fingers $14_2$, and bus $14_1$ for interconnecting fingers $14_2$. Fingers $12_2$ and $14_2$ are placed in an alternating pattern with a very small space between the neighboring fingers. Therefore, each finger $12_2/14_2$ forms a sub capacitor(s) with its neighboring fingers $14_2/12_2$ or a bus $14_1/12_1$. The total capacitance is equivalent to the sum of the sub capacitors.

FIG. 4 illustrates a top view of the capacitor 10 in a second metallization layer (refer to the top or the bottom layer in FIG. 2), which overlies the bottom metallization layer. Typically, the direction of the fingers in the second metallization layer is orthogonal to the direction of the fingers in the bottom metallization layer. Similarly, electrodes 12 and 14 in the second metallization layer include buses $12_1$ and $14_1$ and a plurality of fingers $12_2$ and $14_2$, respectively. Typically, buses $12_1$ in all the layers have similar shapes and sizes and are overlapped vertically. Buses $14_1$ in all the layers also have similar shapes and sizes and are overlapped vertically. Vias 16 connect buses $12_1$ in the first and the second metallization layers, thereby forming an integral electrode 12. Similarly, vias 18 connect buses $14_1$ in neighboring layers, thereby forming an integral electrode 14.

To further increase the capacitance of MOM capacitors, the regions underlying the bottom metallization layer were also used to form a layer of the MOM capacitors. The resulting structure is similar to the structure as shown in FIG. 2, except that layer 1 of the MOM capacitor 10 is now formed in an inter-layer dielectric layer. Referring back to FIG. 3, in this case, electrodes 12 and 14 are formed of doped polysilicon, and layers 1 and 2 are interconnected by contact plugs, instead of vias.

The introduction of the polysilicon MOM layer results in the increase in capacitance of the MOM capacitors. However, the use of polysilicon causes the degradation of the high-frequency response of the MOM capacitors, particularly at frequencies of about 1 GHz or higher. For example, the Q-factors of the capacitors having polysilicon layers may be degraded by about 74% compared to the MOM capacitors that have all layers formed of metals. Accordingly, new structures and manufacturing methods are needed to take advantage of the increased capacitance by forming a capacitor layer underlying the bottom metallization layer, without sacrificing high-frequency response.

SUMMARY OF THE INVENTION

In accordance with one aspect of the present invention, a semiconductor structure includes a substrate; and a capacitor over the substrate. The capacitor includes a first layer comprising a first capacitor electrode and a second capacitor electrode, wherein the first capacitor electrode is formed of a metal-containing material. The semiconductor structure further includes a MOS device including a gate dielectric over the substrate; and a metal-containing gate electrode on the gate dielectric, wherein the metal-containing gate electrode is formed of a same material, and at a same level, as the first capacitor electrode.

In accordance with another aspect of the present invention, a semiconductor structure includes a substrate; and a metal-oxide-semiconductor (MOM) capacitor over the substrate. The MOM capacitor includes a first layer including a first capacitor electrode and a second capacitor electrode, each of the first and the second capacitor electrodes including a bus and a plurality of fingers. The fingers of the first and the second capacitor electrodes are parallel to each other and are placed in an alternating pattern. The first and the second capacitor electrodes are metal features. The MOM capacitor further includes a second layer in a bottom metallization layer and over the first layer, the second layer including a third capacitor electrode and a fourth capacitor electrode, wherein the third and the fourth capacitor electrodes are insulated from each other; a first contact plug electrically connecting the first and the third capacitor electrodes; and a second contact plug electrically connecting the second and the fourth capacitor electrodes. The semiconductor structure further includes a MOS device, which includes a gate dielectric over the substrate; and a gate electrode on the gate dielectric, wherein the gate electrode is formed of a same material, and at a same level, as the first and the second capacitor electrodes, and wherein the gate electrode comprises metal.

In accordance with yet another aspect of the present invention, a semiconductor structure includes a substrate; and a metal-insulator-metal (MIM) capacitor over the substrate. The MIM capacitor includes a bottom plate; an insulating layer over the bottom plate; and a top plate over the insulating layer. The semiconductor structure further includes a MOS device including a first gate dielectric over the substrate; and a first gate electrode on the first gate dielectric, wherein the first gate electrode is formed of a same material, and at a same level, as the bottom plate, and wherein the first gate electrode and the bottom plate include metal.

In accordance with yet another aspect of the present invention, a method of forming a semiconductor structure includes providing a substrate; forming a capacitor over the substrate, and forming a MOS device at a surface of the substrate. The step of forming the capacitor includes forming a first layer comprising a first capacitor electrode and a second capacitor electrode, wherein the first capacitor electrode is formed of a metal-containing material and is free from polysilicon. The step of forming the MOS device includes forming a gate dielectric over the substrate; and forming a metal-containing gate electrode on the gate dielectric. The steps of forming the first capacitor electrode and the metal-containing gate electrode includes forming a metal-containing layer; and patterning the metal-containing layer to form the first capacitor electrode and the metal-containing gate electrode.

In accordance with yet another aspect of the present invention, a method of forming a semiconductor structure includes providing a substrate; and forming a PMOS device, an NMOS device and a MOM capacitor on the substrate. The step of forming the PMOS device includes forming a first gate dielectric over the substrate; and forming a first gate electrode on the first gate dielectric. The step of forming the NMOS device includes forming a second gate dielectric over the substrate; and forming a second gate electrode on the second gate dielectric. The step of forming the MOM capacitor includes forming a first layer comprising a first capacitor electrode and a second capacitor electrode, each comprising a first sub-layer and a second sub-layer, wherein the first sub layer is formed simultaneously with the first gate electrode, and wherein the second sub-layer is formed simultaneously with the second gate electrode.

In accordance with yet another aspect of the present invention, a method for forming a semiconductor structure includes providing a substrate; forming a first dielectric layer over the substrate; forming a first conductive layer over the first dielectric layer, wherein the first conductive layer contains a metal and is free from polysilicon; forming a second dielectric layer over the first conductive layer; forming a second conductive layer over the second dielectric layer; patterning the second conductive layer to form a top plate of a MIM capacitor; patterning the second dielectric layer to form a capacitor insulating layer of the MIM capacitor; patterning the first conductive layer to form a first gate electrode of a first metal-oxide-semiconductor (MOS) device and a bottom plate of the MIM capacitor; and patterning the first dielectric layer to form a first gate dielectric of the first MOS device and a dielectric layer underlying the MIM capacitor.

The advantageous features of the present invention include forming capacitors with increased capacitance and improved electrical performance without increasing the manufacturing cost.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Metal-oxide-metal (MOM) and metal-insulator-metal (MIM) capacitor structures and the methods of forming the same are provided. The intermediate stages of manufacturing the preferred embodiments of the present invention are illustrated. The variations of the preferred embodiments are then discussed. Throughout the various views and illustrative embodiments of the present invention, like reference numbers are used to designate like elements.

Figure 1:
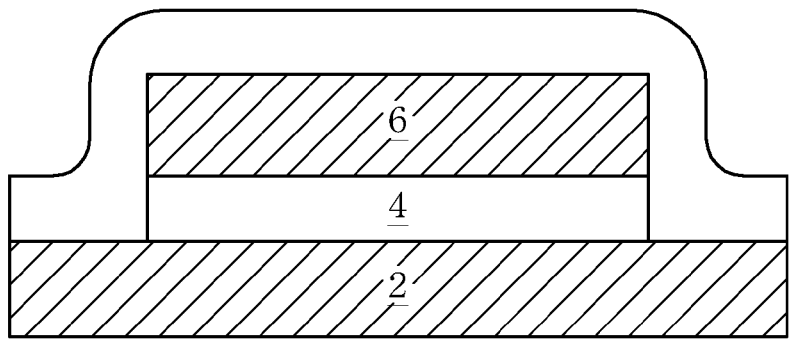
FIG. 1 illustrates a conventional metal-insulator-metal (MIM) capacitor.
Figure 2:
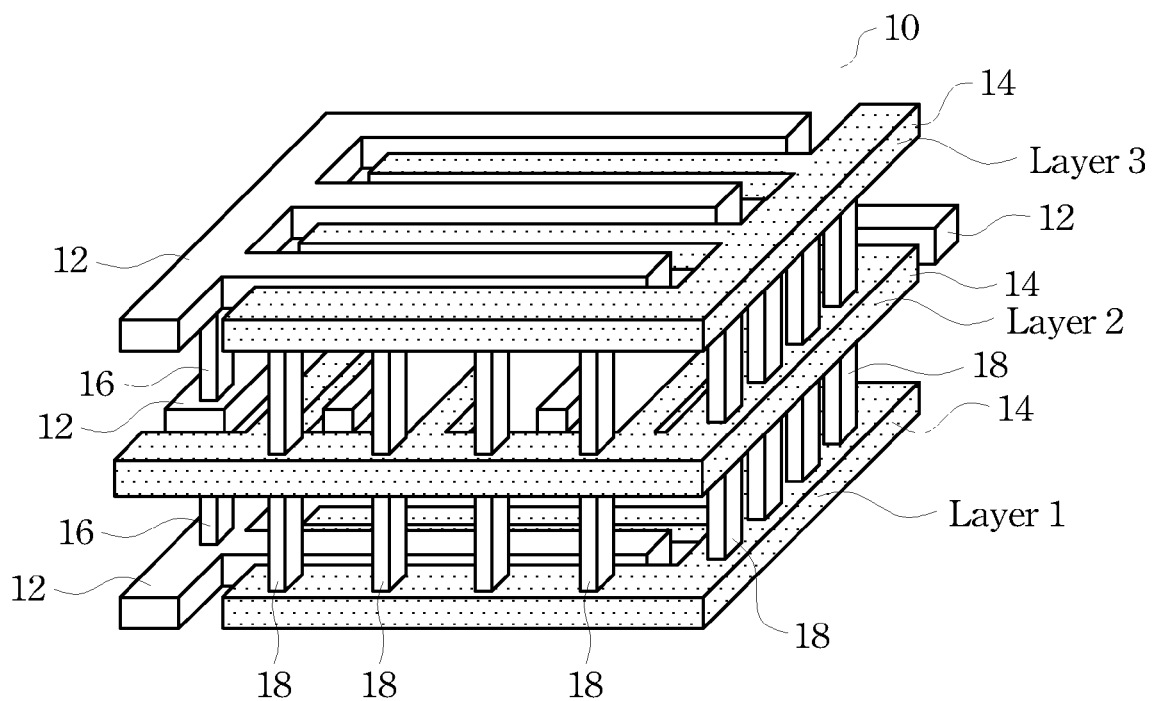
FIGS. 2 through 4 illustrate views of a conventional metal-oxide-metal (MOM) capacitor.
Figure 3:
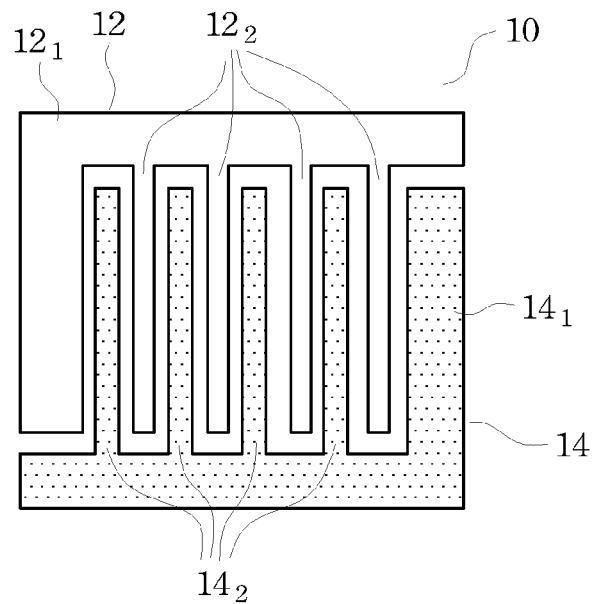
Figure 4:
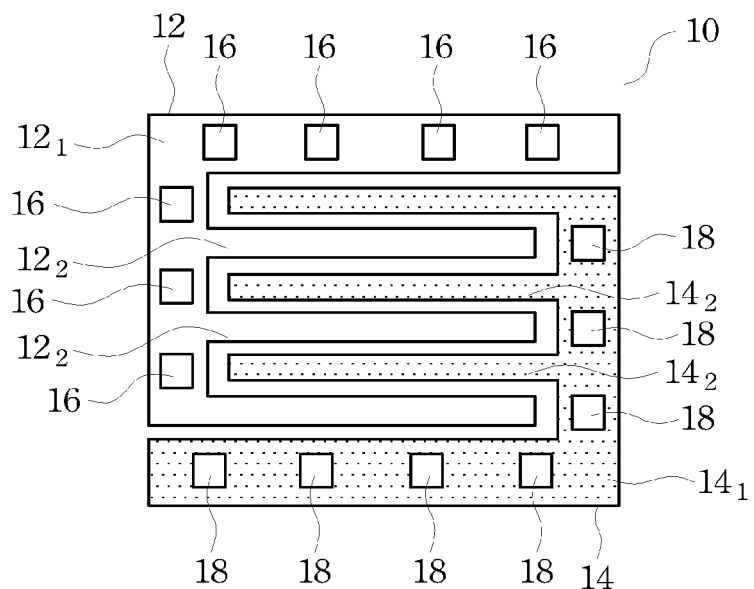
Figure 5:
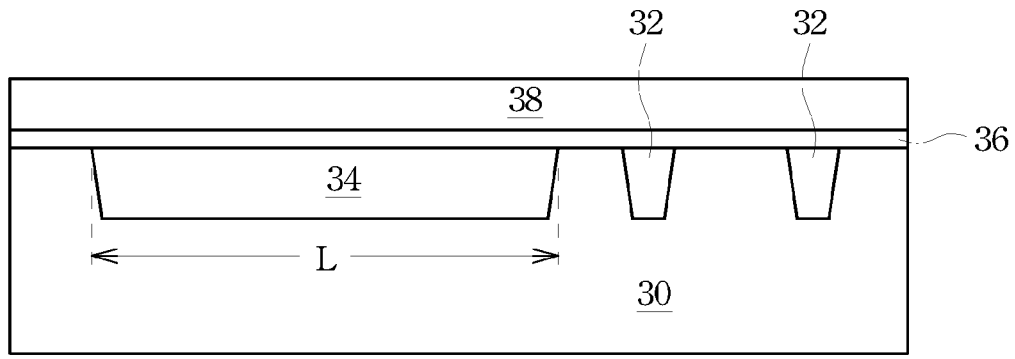
FIGS. 5 through 9B illustrate intermediate stages in the manufacturing of an embodiment of the present invention, wherein a capacitor includes a layer formed in an inter-layer dielectric (ILD)

Referring to FIG. 5, substrate 30 is provided. Substrate 30 may include a semiconductor material such as silicon, silicon germanium, and the like, and may either be in the form of a bulk substrate, or a silicon-on-insulator substrate. Shallow trench isolation (STI) regions 32 and 34 are formed in substrate 30. STI region 34 preferably has a length L and a width (in a direction perpendicular to the illustrated plane) of between about 0.1 μm and about 100 μm.

Gate dielectric layer 36 and gate electrode layer 38 are formed on substrate 30. Gate dielectric layer 36 may be formed of a silicon oxide, silicon nitride, silicon oxynitride, and the like, and may be a composite layer having, for example, an oxide-nitride-oxide structure. Gate dielectric layer 36 may also be formed of high-k dielectric materials have k values of greater than about 3.9.

In the preferred embodiment, gate electrode layer 38 is a metal-containing layer, which may include substantially pure metals or metal compounds, such as metal silicides, metal nitrides, and the like. Gate electrode layer 38 may also be a composite layer including a silicide layer and a metal layer, wherein the silicide layer is preferably on the top of, although it may be underlying, the metal layer.

Figure 6A:
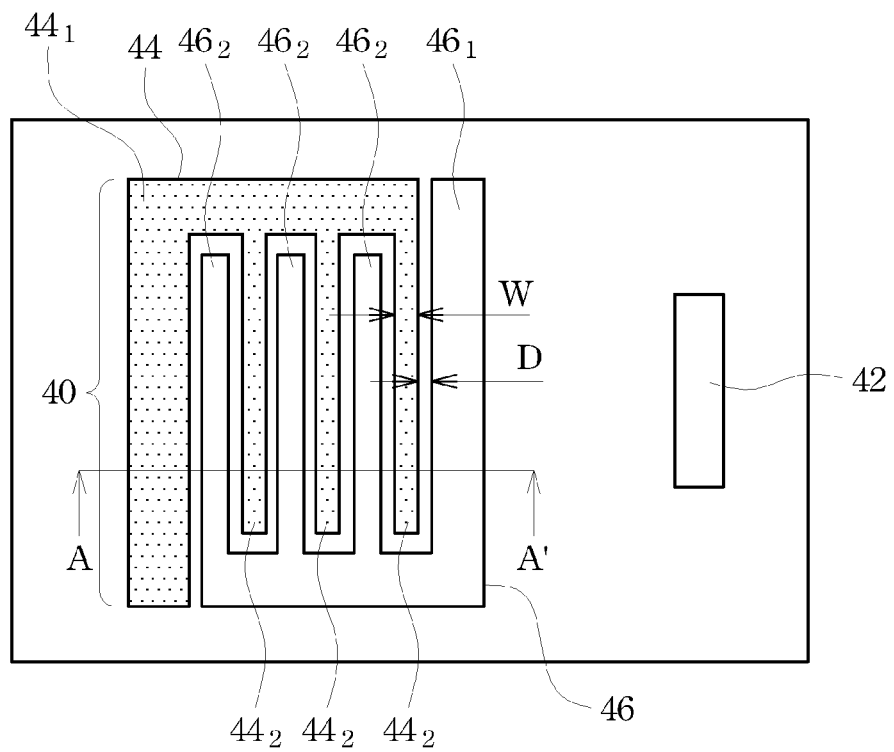
Figure 6B:
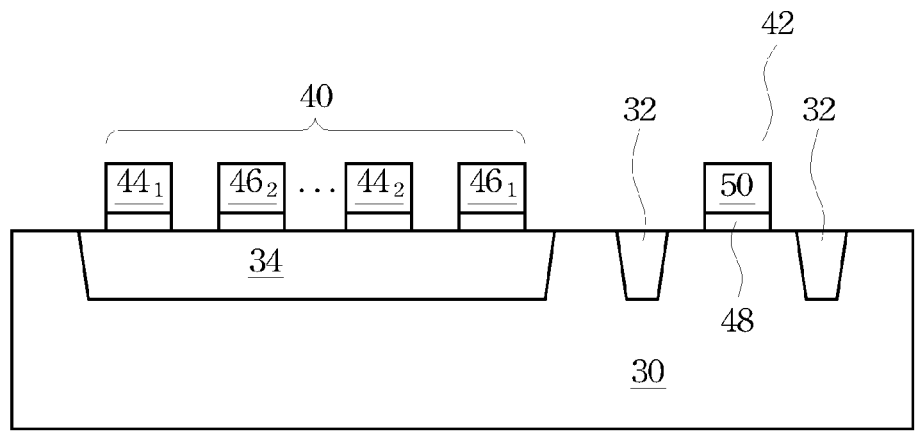

In FIGS. 6A and 6B, gate electrode layer 38 and dielectric layer 36 are patterned, forming a bottom layer (layer 1) 40 of a MOM capacitor and gate stack 42 of a metal-oxide-semiconductor (MOS) device. Bottom layer 40 further includes capacitor electrodes 44 and 46. FIG. 6A is a top view of the bottom layer 40, which shows that electrode 44 includes interconnected bus $44_1$ and fingers $44_2$, and electrode 46 includes interconnected bus $46_1$ and fingers $46_2$. FIG. 6B is a cross-sectional view taken along a plane crossing plane A-A' in FIG. 6A. Fingers $44_2$ and $46_2$ are parallel to each other and placed in an alternating pattern, so that each of the fingers $44_2/46_2$ forms a sub-capacitor with the neighboring fingers $46_2/44_2$. Electrode 44 is shaded in the subsequent top views and perspective views for easy identification. Preferably, fingers $44_2$ and $46_2$ have a width W of between about 0.005 μm and about 0.1 μm. As is know in the art, the capacitance between two neighboring capacitor plates is inversely proportional to the distance between the neighboring capacitor plates. Accordingly, the distance D between the neighboring fingers $44_2$ and $46_2$ is preferably small. In an exemplary embodiment, distance D is between about 0.005 μm and about 0.1 μm. In another embodiment, distance D is equal to the minimum feature size allowed by the formation technology. One skilled in the art will realize that width W and distance D are related to the technologies used and will be reduced when the integrated circuits are scaled down.

At the time the bottom layer 40 of the MOM capacitor is formed, gate stack 42, which includes gate dielectric 48 and gate electrode 50, is also formed simultaneously.

Figure 7:
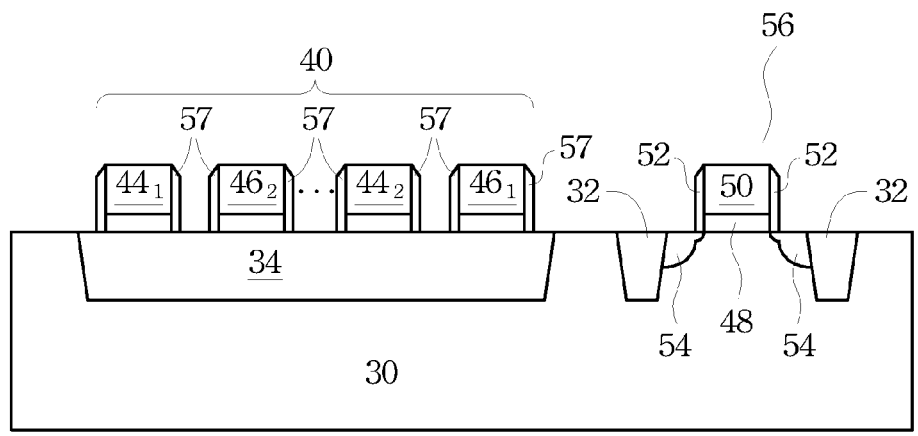

Next, as is shown in FIG. 7, gate spacers 52 and source/drain regions 54 are formed, and hence forming MOS device 56. As is known in the art, gate spacers 52 may be formed by forming a spacer layer, and then removing the horizontal portions of the spacer layer via etching. The remaining portions of the spacer layer form gate spacers. Spacers 57 are also formed on sidewalls of the fingers and buses of the bottom layer 40. Advantageously, spacers 57 have a relatively high k value, which is beneficial for increasing the capacitance of the MOM capacitor. Spacers 52 and 57 may include silicon oxide, silicon nitride, silicon oxynitride, and may also include composite layers including, for example, a silicon nitride layer on a silicon oxide layer. The formation process of source/drain regions 54 is known in the art, and thus is not repeated herein.

Figure 8A:
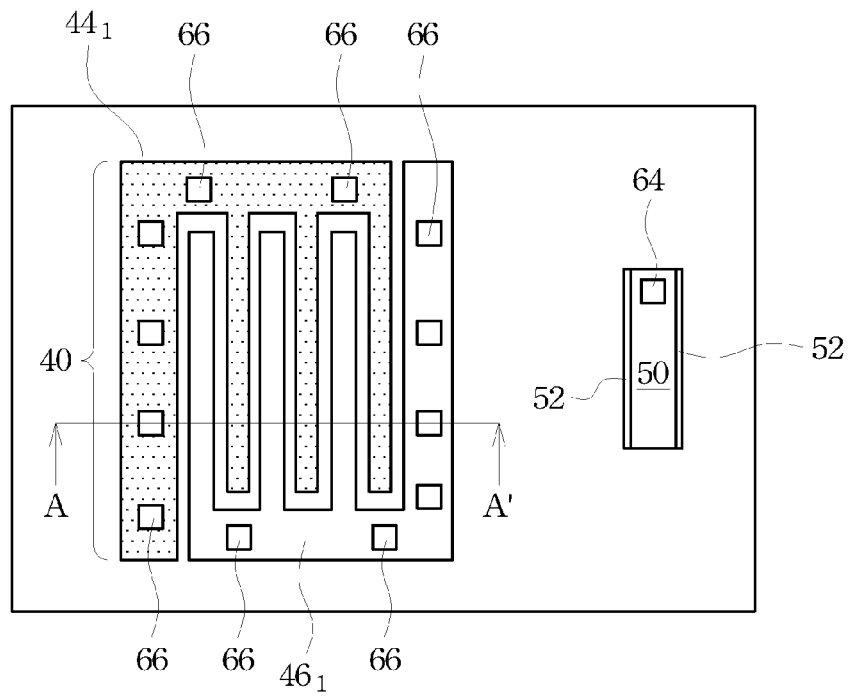
Figure 8B:
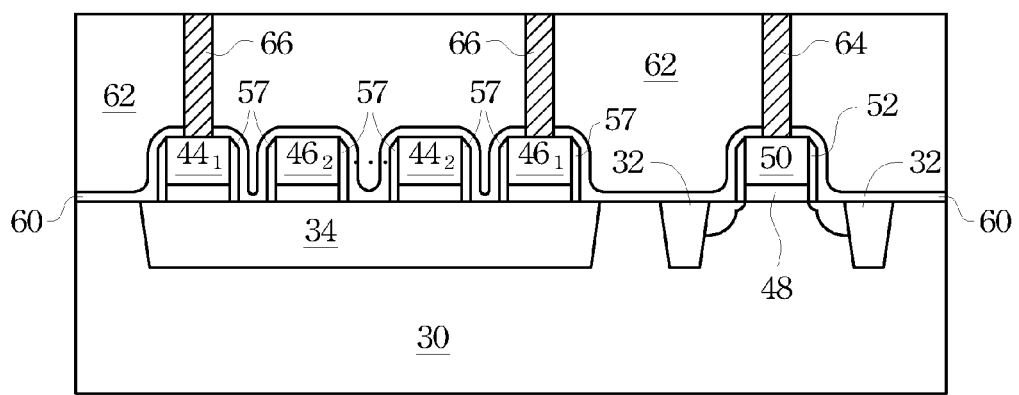

FIGS. 8A and 8B illustrate the formation of contact etch stop layer (CESL) 60, inter-layer dielectric (ILD) 62, and contacts 64 and 66. FIG. 8A is a top view. FIG. 8B is a cross-sectional view of the structure shown in FIG. 8A, wherein the cross-sectional view is taken along a plane crossing line A-A'. Referring to FIG. 8B, CESL 60 is blanket formed, followed by the formation of ILD 62. CESL 60 may be formed of silicon nitride, silicon carbide, silicon oxide, and the like. ILD 62 may be formed of boronphosphosilicate glass (BPSG) or other known ILD materials. Contacts 64 and 66 are then formed to connect to gate electrode 50 and the bottom layer 40 of the MOM capacitor, respectively. As is known in the art, the formation of contacts 64 and 66 includes forming contact openings in ILD 62 and CESL 60, and then filling the contact openings with metallic materials. Contacts 64 and 66 preferably include tungsten, however, other metals and metal alloys including tungsten, copper, aluminum, silver, gold, and the like, may also be used. Preferably, buses $44_1$ and $46_1$ are each connected to at least one, preferably more, contacts 66.

Figure 9A:
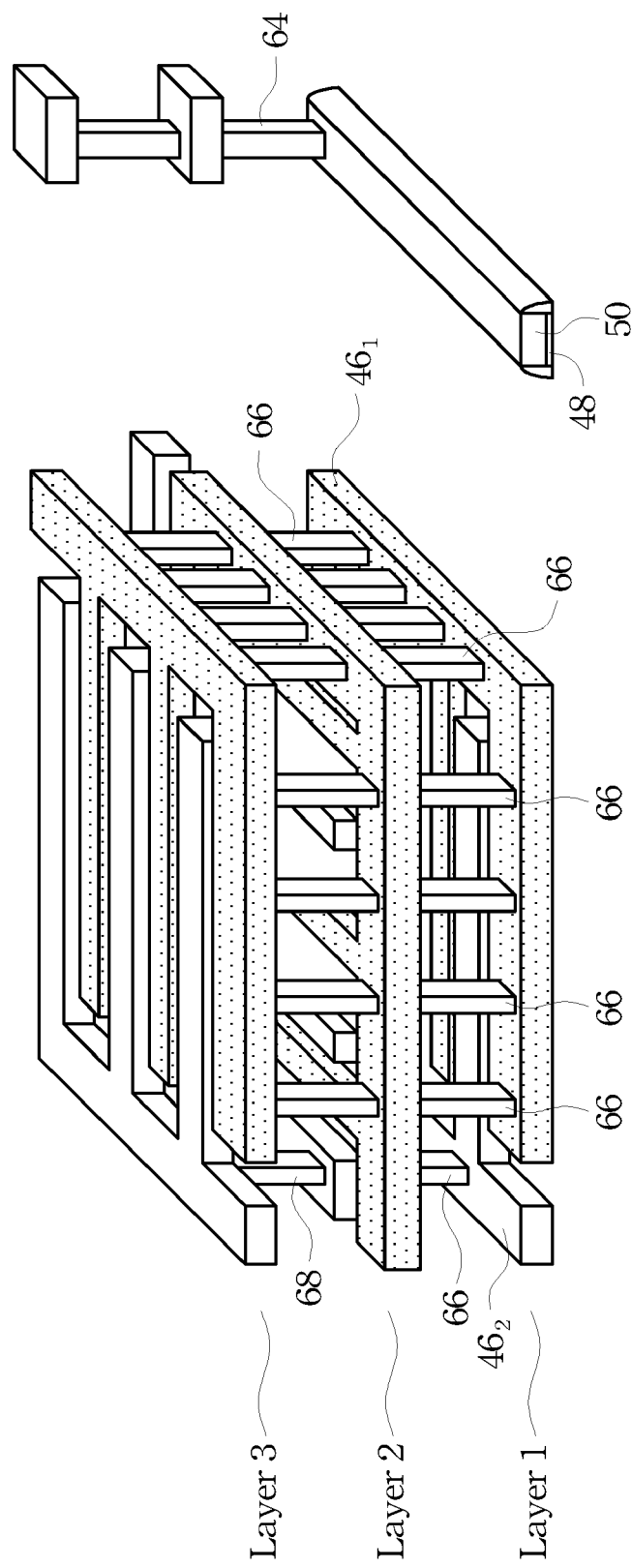
Figure 9B:
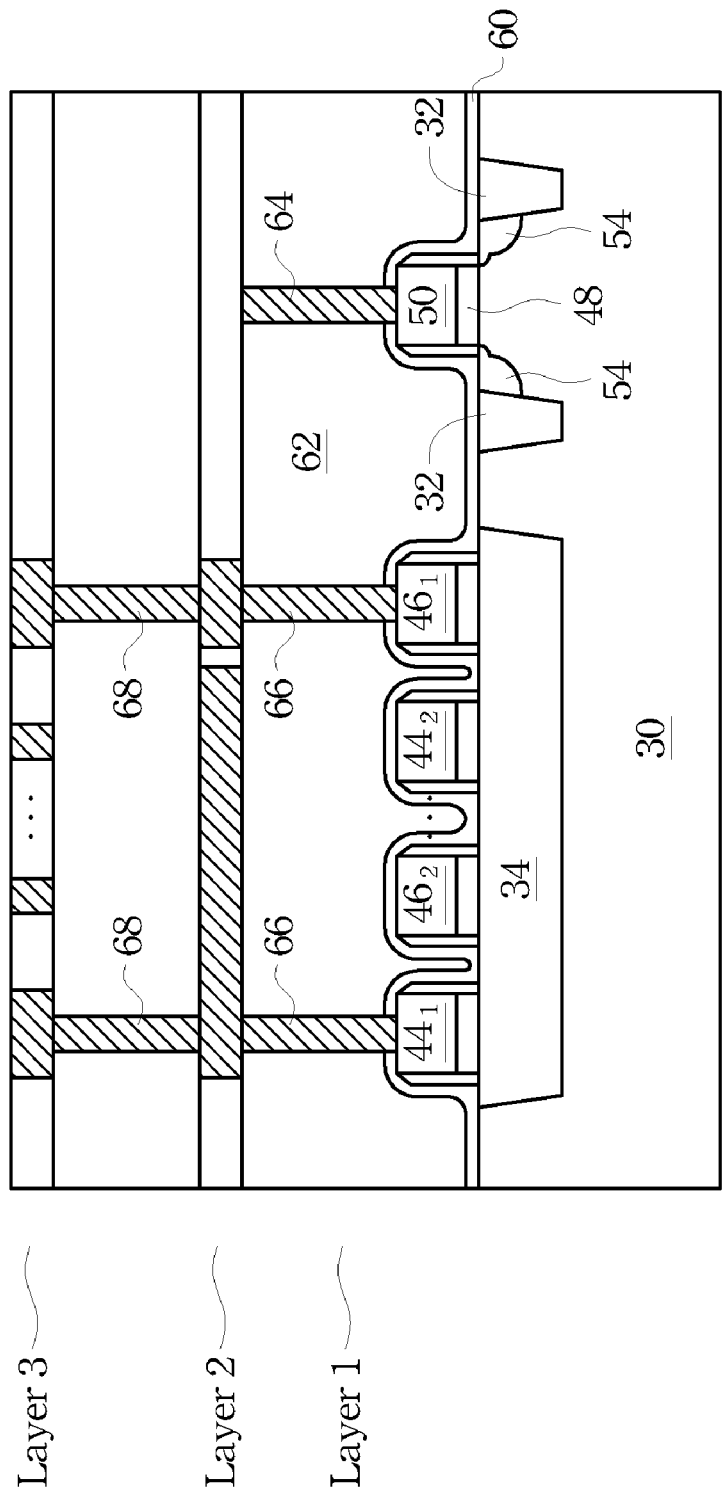

In the preferred embodiment, more capacitor layers are formed in the metallization layers, and are connected to layer 1 of the MOM capacitor in order to increase the capacitance of the MOM capacitor. FIGS. 9A and 9B illustrate the formation of layer 2 and layer 3 of the MOM capacitor. FIG. 9A is a perspective view, while FIG. 9B is a cross-sectional view. For a clear view, CESL 60, ILD 62, and source/drain regions 54 are not shown in FIG. 9A. Layer 2 of the MOM capacitor is formed in the bottom metallization layer, which is commonly referred to as M1, and is preferably formed using a single damascene process. Layer 3 of the MOM capacitor is formed in the second metallization layer, which is commonly referred to as M2. Layer 2 and layer 3 are interconnected by vias 68. Layer 3 and via 68 are preferably formed using a dual damascene process. Each of the layers 2 and 3 may have a similar pattern as layer 1. Although FIGS. 9A and 9B show that the fingers in layer 2 are perpendicular to the fingers in layers 1 and 3, they can also be parallel to each other.

Figure 10:
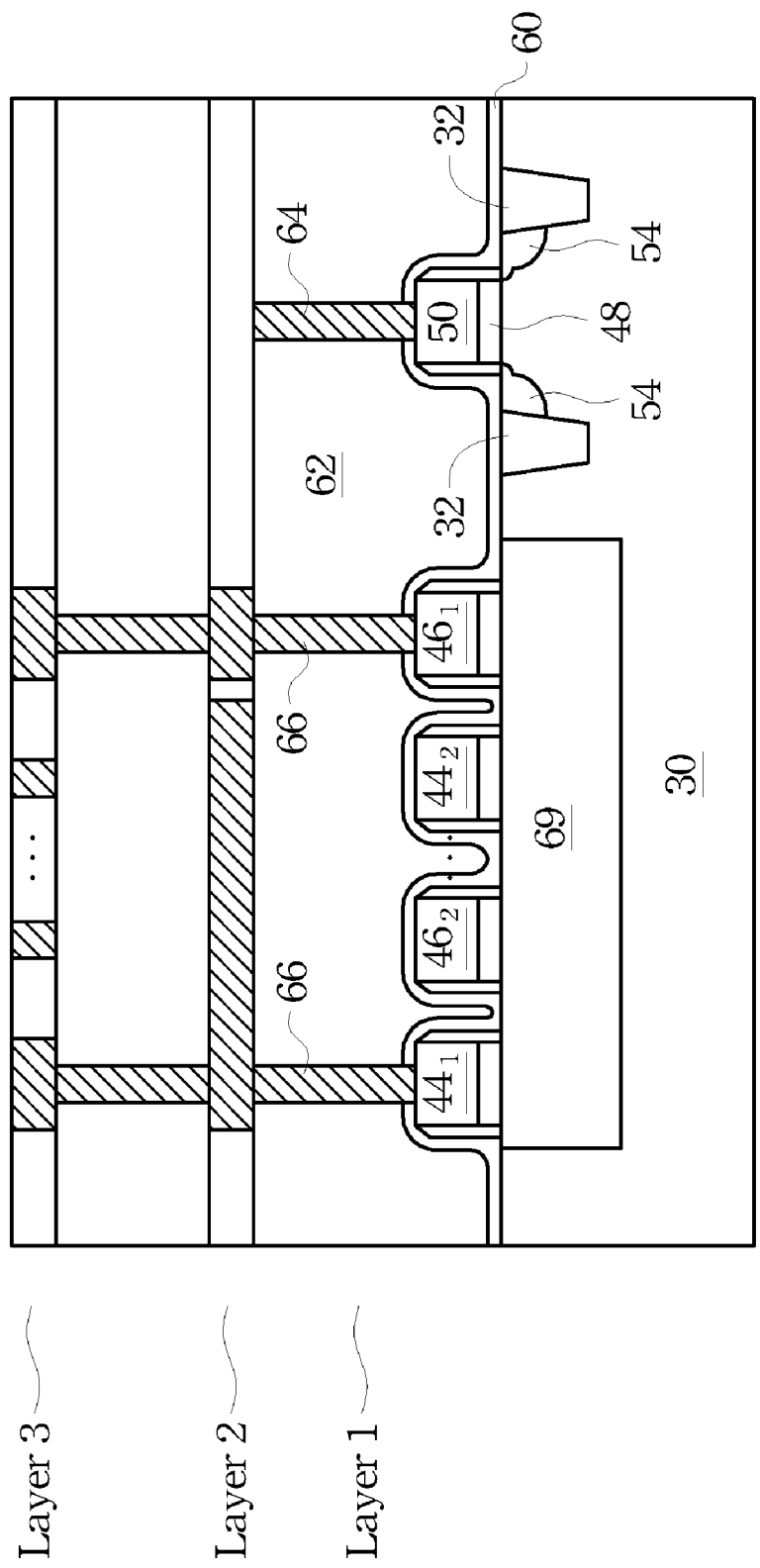
FIG. 10 illustrates a MOM capacitor formed over a well region.

FIG. 10 illustrates an alternative embodiment of the present invention, wherein the layer 1 of the MOM capacitor is formed over well region 69 of substrate 30, with no STI region under the MOM capacitor. The MOM capacitor is electrically insulated from substrate 30 by a dielectric layer, which is preferably formed simultaneously with the formation of gate dielectric 48.

Figure 11:
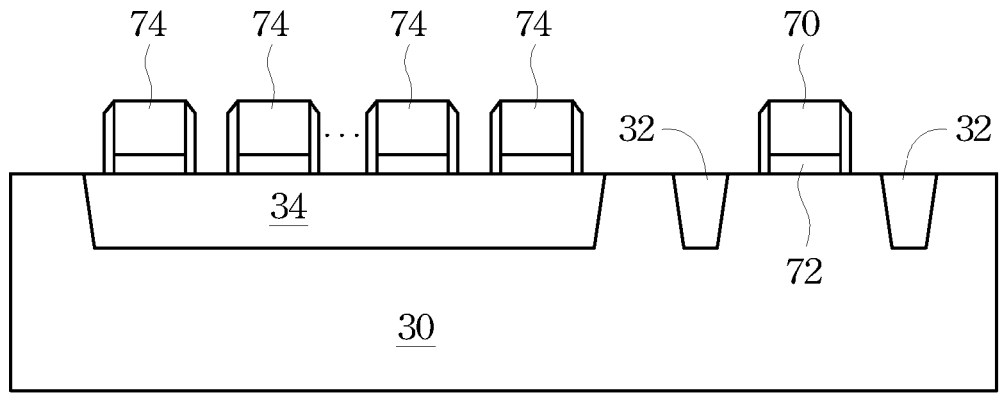
FIGS. 11 through 13 illustrate an embodiment of the present invention formed using a gate-last approach.
Figure 12:
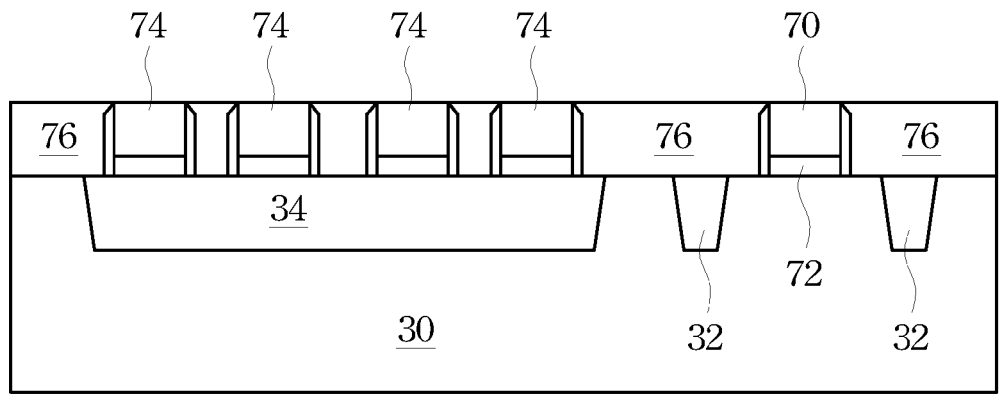
Figure 13:
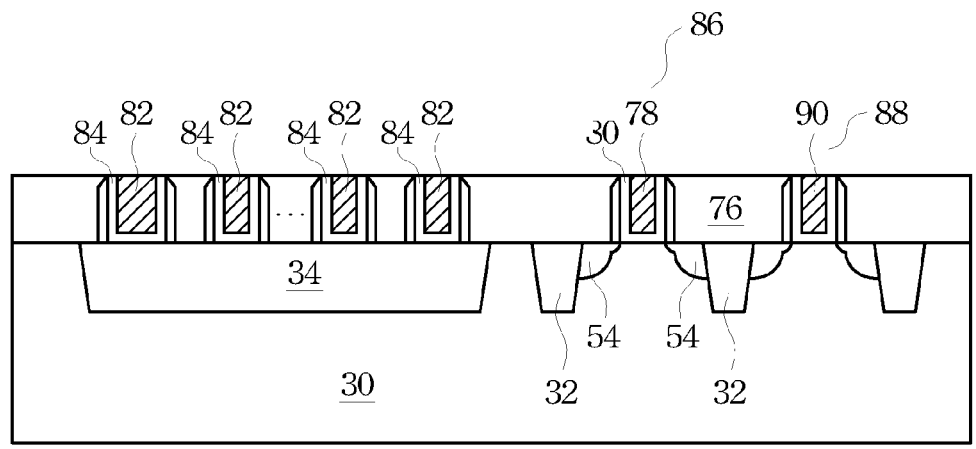

The embodiment discussed in the preceding paragraphs is formed using a gate-first approach, wherein gate electrode 50 is formed before the formation of source/drain regions 54. FIGS. 11 through 13 illustrate a gate-last approach. Referring to FIG. 11, dummy gate electrode 70, dummy gate dielectric 72, and dummy capacitor electrodes 74 are formed. The formation processes are essentially the same as shown in FIGS. 5 through 7. Dummy gate electrode 70 may include polysilicon, while dummy gate dielectric 72 may include silicon oxide.

Referring to FIG. 12, ILD 76 is formed, and a chemical mechanical polish (CMP) is performed to level the top surface of ILD 76 to the top surface of dummy gate electrode 70 and dummy capacitor electrodes 74. Dummy gate electrode 70, dummy gate dielectric 72, and dummy capacitor electrodes 74 are then removed. Next, a gate dielectric layer and a gate electrode layer, which may include essentially the same materials as gate dielectric layer 36 and gate electrode layer 38 (refer to FIG. 5), respectively, are blanket formed. A CMP process is then performed to form the structure as shown in FIG. 13. The resulting structure includes gate dielectric 80, gate electrode 78, capacitor electrodes 82, and dielectrics 84. Preferably, gate electrode 78 and dielectrics 84 includes high-k dielectric materials, which not only benefit the MOS device, but also helps to increase the capacitance of the MOM capacitor An integrated circuit typically includes PMOS devices and NMOS devices. As is known in the art, the gate electrodes of the PMOS devices and NMOS devices may be formed of different materials having different work functions. For example, the gate electrode of a PMOS device preferably has a work function of greater than about 4.9 eV, while the gate electrode of an NMOS device preferably has a work function of less than about 4.2 eV. FIG. 13 illustrates an additional MOS device. Assuming MOS device 86 is a PMOS device, and MOS device 88 is an NMOS device, the bottom layer of the MOM capacitor may be formed simultaneously with either the gate electrode 78 of PMOS device 86, or gate electrode 90 of NMOS device 88. Similarly, the bottom layer of the MOM capacitor may be formed using the gate-first approach, and formed simultaneously with either the gate electrode of PMOS device 86, or the gate electrode of NMOS device 88.

In each layer of the multi-layer MOM capacitor, the capacitor electrodes may have different shapes than shown in FIG. 9A. For example, instead of being formed as interconnected buses and fingers, each of the two capacitor electrodes in a layer may be spiral-shaped or L-shaped.

Figure 14:
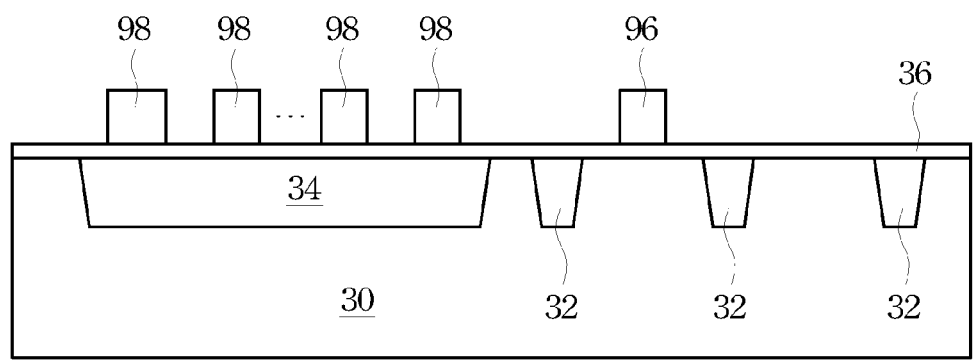
FIGS. 14 through 16 illustrate intermediate stages in the manufacturing of a further embodiment of the present invention, wherein the bottom layer of a MOM capacitor includes a sub-layer formed simultaneously with a PMOS device, and a sub-layer formed simultaneously with an NMOS device.
Figure 15:
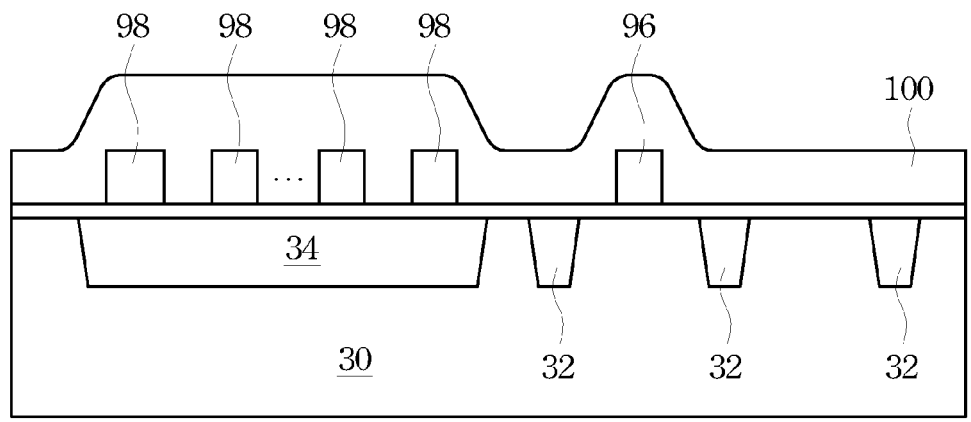
Figure 16:
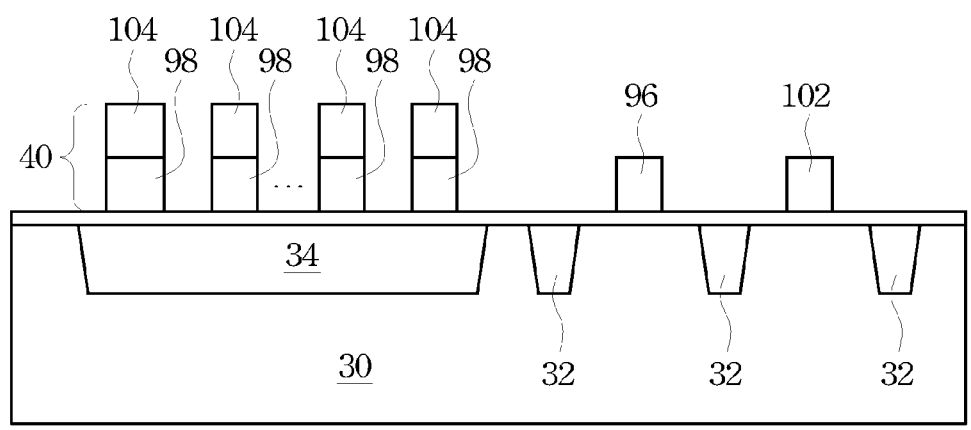

FIGS. 14 through 16 illustrate a third embodiment of the present invention. The initial step is essentially the same as shown in FIG. 5. Next, gate electrode layer 38 is patterned, forming a structure as shown in FIG. 14, which includes gate electrode 96 of a PMOS device and a first sub-layer 98 of layer 1 of the MOM capacitor. FIG. 15 illustrates the formation of an additional gate electrode layer 100, which can be formed of metals, metal nitrides, metal silicides, and the like. Gate electrode layers 38 (refer to FIG. 5) and 96 may be formed of different metal-containing materials. In an exemplary embodiment, one of the gate electrode layers 38 and 96 has a high work function, for example, greater than about 4.9 eV, while the other one has a low work function, for example, less than about 4.2 eV.

FIG. 16 illustrates the patterning of gate electrode layer 100. Preferably, an etchant that attacks gate electrode layer 100, but not gate electrode layer 38, is used. In the resulting structure, the bottom layer 40 of the MOM capacitor includes sub-layer 104 stacked on sub-layer 98. In subsequent process steps, gate spacers, ESL, ILD, and the overlying layers of the MOM capacitor are formed, which steps are essentially the same as shown in FIGS. 7 through 9B. Advantageously, in this embodiment, the bottom layer 40 has a thickness close to twice the thickness of a MOS devices. The capacitance contributed by the bottom layer of the MOM capacitor is thus substantially doubled.

Figure 17:
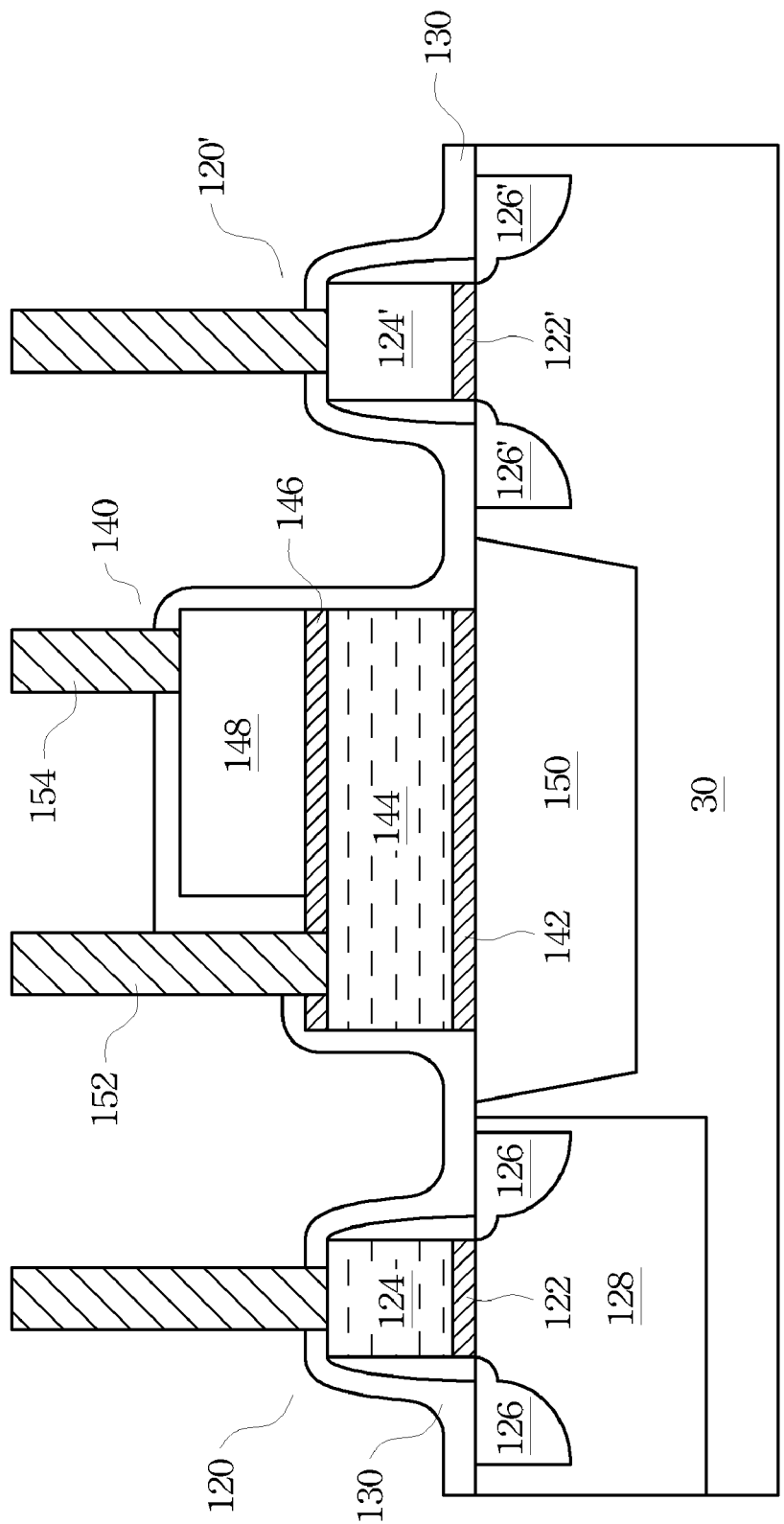
FIGS. 17 through 21 illustrate MIM capacitor embodiments.
Figure 18A:
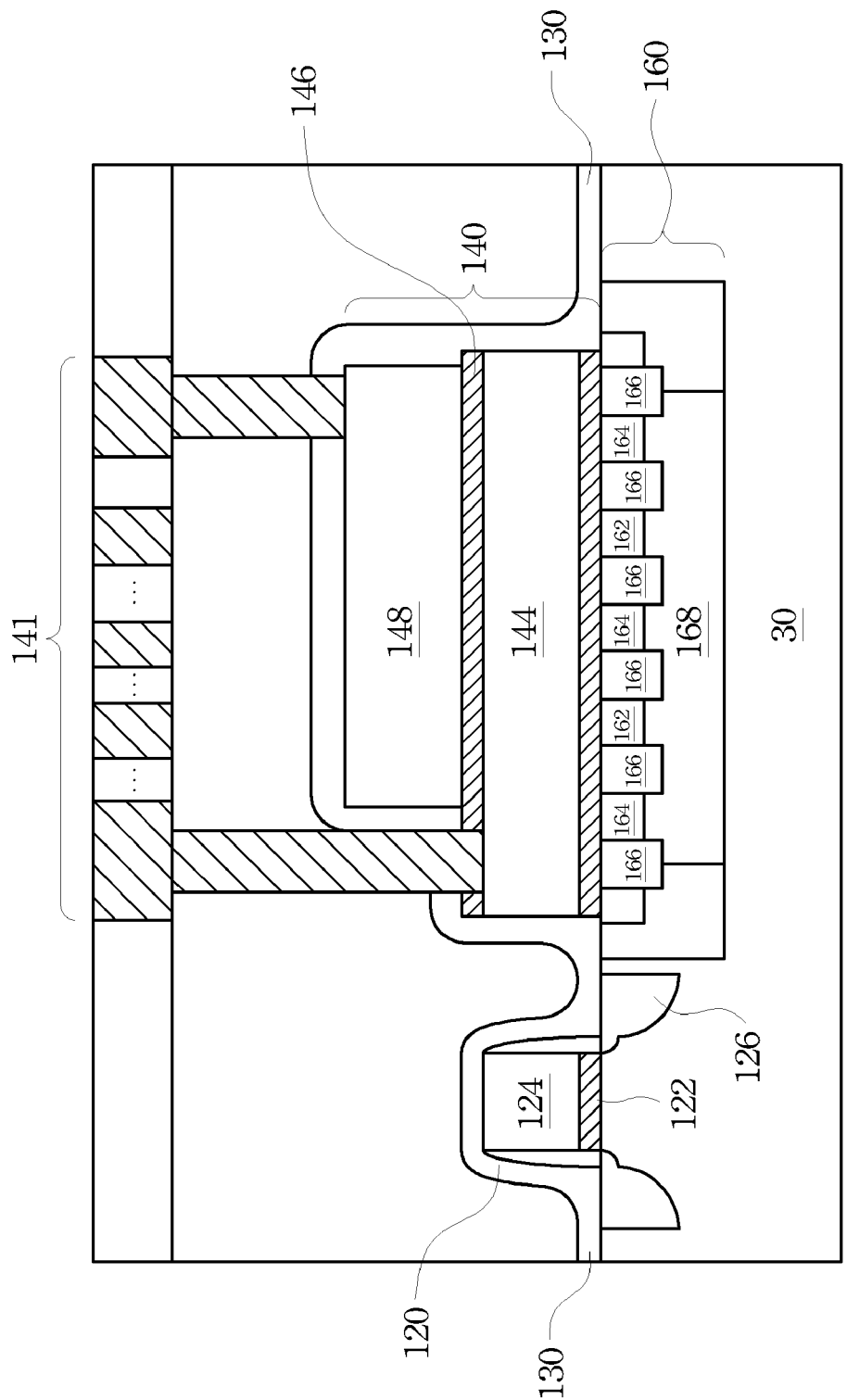

FIGS. 17 and 18A illustrate cross-sectional views of metal-insulator-metal (MIM) capacitors. Referring to FIG. 17, MOS device 120 and MIM capacitor 140 are formed over substrate 30. MOS device 120 is formed at the surface of well region 128, and includes gate dielectric 122, source/drain regions 126 and gate electrode 124. MIM capacitor 140 includes bottom plate 144 (also referred to as bottom electrode 144), insulator 146, and top plate 148 (also referred to as top electrode 148). MIM capacitor 140 may be formed over STI region 150, with dielectric layer 142 formed between STI region 150 and bottom plate 144. Contacts 152 and 154 are connected to bottom plate 144 and top plate 148, respectively. Alternatively, dielectric layer 142 is formed on substrate 30 with no underlying STI region.

In the preferred embodiment, gate electrode 124 and bottom plate 144 are simultaneously formed, and hence include same materials, which may be essentially the same as the material of gate electrode layer 38 (refer to FIG. 5). Similarly, gate dielectric 122 and dielectric layer 142 may be simultaneously formed, and hence include same materials.

In a first exemplary embodiment, MOS device 120 is an NMOS device. Accordingly, well region 128 is a p-well region, source/drain regions 126 are of n-type, contact etch stop layer 130 preferably has a tensile stress, and gate electrode 124 preferably has a low work function, for example, less than about 4.2 eV. In a second exemplary embodiment, MOS device 120 is a PMOS device. Accordingly, well region 128 is an n-well region, source/drain regions 126 are of p-type, contact etch stop layer 130 preferably has a compressive stress, and gate electrode 124 and bottom plate 144 preferably have a high work function, for example, less than about 4.9 eV. Whether bottom plate 144 is formed simultaneously with a PMOS device or an NMOS device may be determined by their locations. In an exemplary embodiment, a bottom plate is formed simultaneously with a nearby MOS device.

FIG. 17 also illustrates MOS device 120', which is formed at the surface of well region 128', and includes gate dielectric 122', source/drain regions 126', and gate electrode 124'. MOS devices 120 and 120' are of opposite conductivity types. In an exemplary embodiment, bottom plate 144 is formed simultaneously with the formation of gate electrode 124, while top plate 148 is formed simultaneously with, and hence include same materials as, gate electrode 124'. One skilled in the art will realize the corresponding formation processes.

To further increase the capacitance per unit chip area, varactors, which act as capacitors, may be formed with at least portions underlying MIM capacitors. FIG. 18A illustrates an exemplary embodiment. Varactor 160 includes a plurality of fingers 162 and 164 formed in well region 168, which are further separated by STI regions 166. Fingers 162 and 164 are arranged in an alternating pattern, and have opposite conductivity types. Fingers 162 are interconnected to form one plate of varactor 160. Fingers 164 are also interconnected to form another plate of the varactor 160. MIM capacitor 140, which is essentially the same as shown in FIG. 17, is formed on top of varactor 160. FIG. 18A also schematically illustrates MOM capacitor 141 formed over MIM capacitor 140. The formation of MOM capacitor 141 may be essentially the same as illustrated in FIGS. 9A and 9B. MOM capacitor 141 is preferably connected in parallel to MIM capacitor 140 and varactor 160 in order to increase the total capacitance.

Figure 18B:
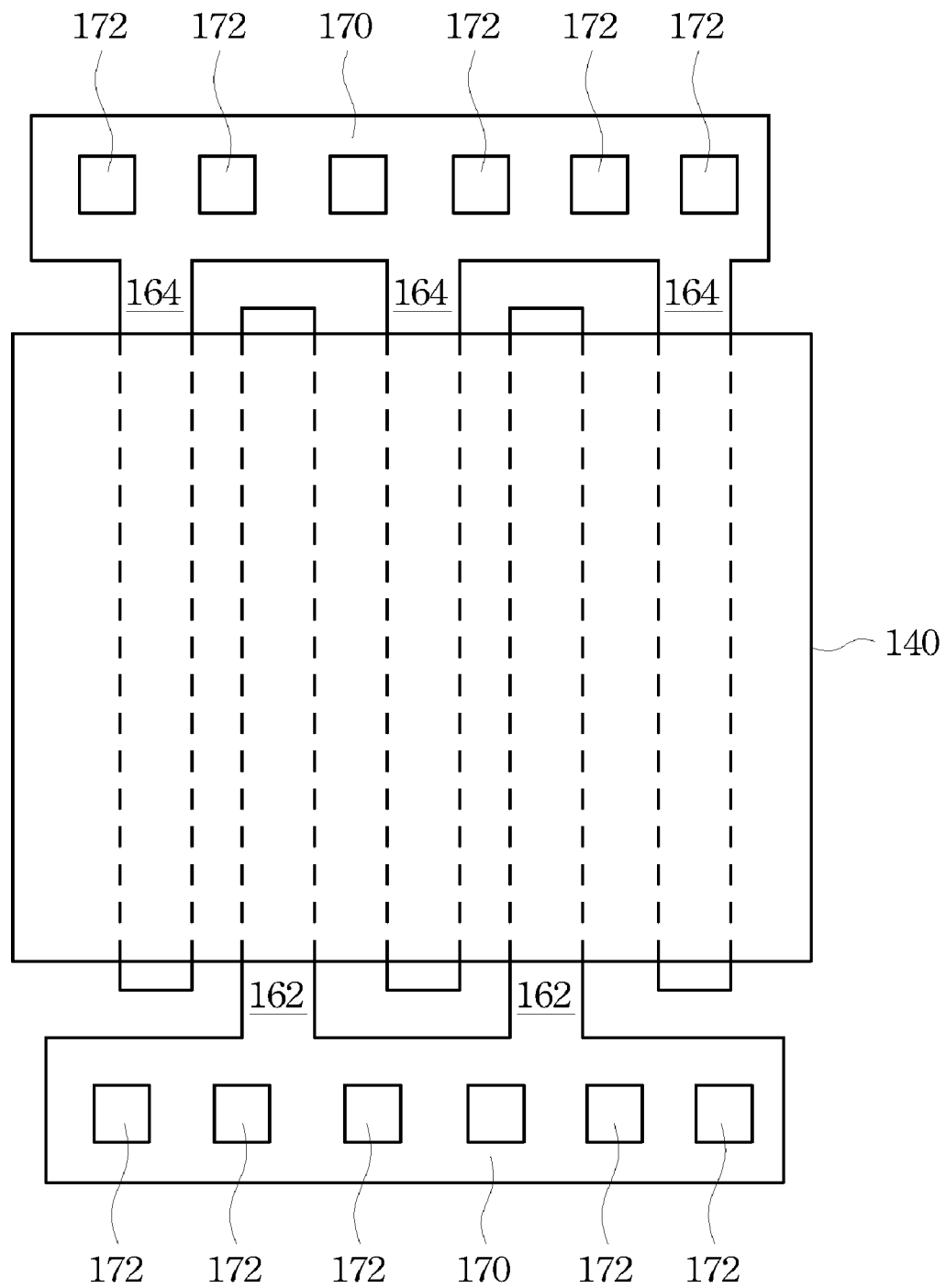

FIG. 18B illustrates a top view of the structure shown in FIG. 18A. The pickup regions 170 of fingers 162 and 164 are formed outside the region of MIM capacitor 140, and contacts 172 are made to electrically connect to fingers 162 and 164. It is appreciated that varactor 160 can be formed partially, or substantially entirely (except the pickup regions 170), under MIM capacitor 140. Forming varactors under MIM and/or MOM capacitors effectively saves the chip area. One skilled in the art will realize that there are other types of varactors, and they can also be formed similar to the embodiment shown in FIGS. 18A and 18B.

Figure 19A:
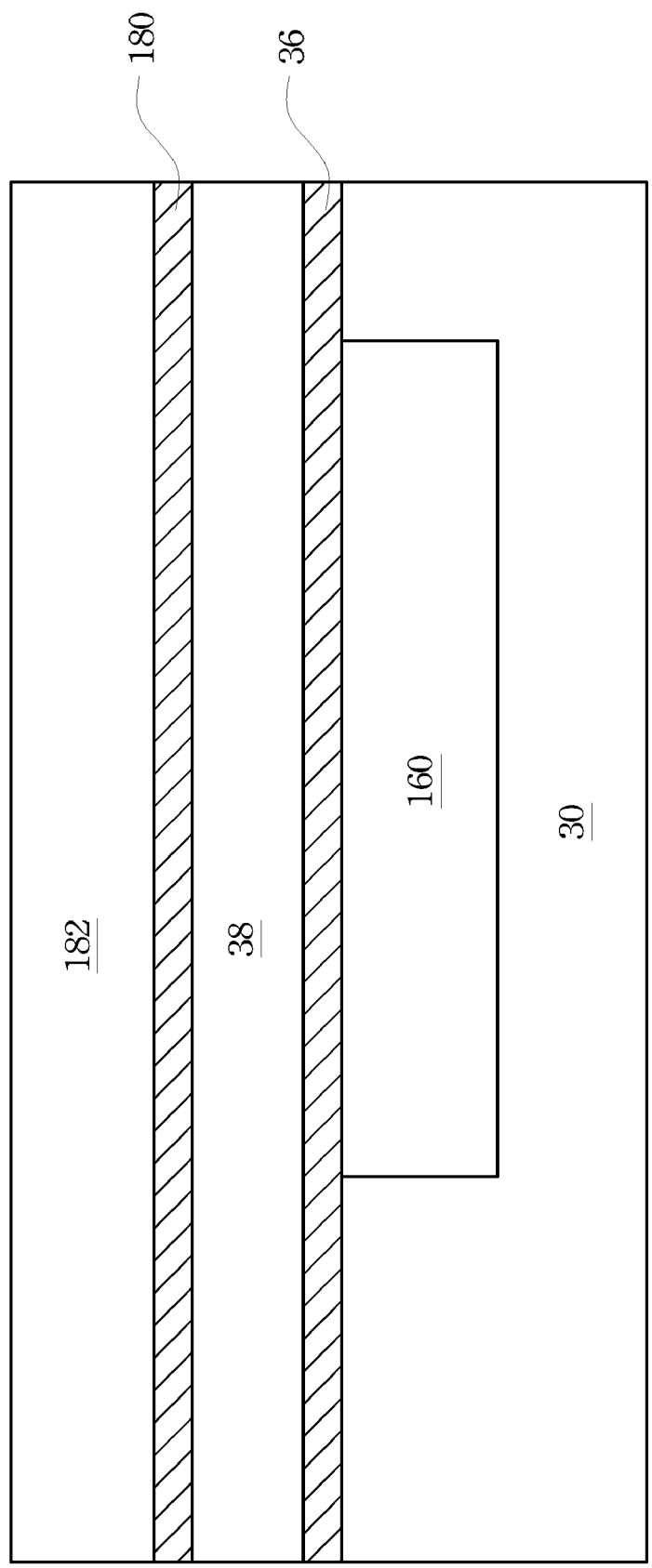

A brief formation process of the structure show in FIG. 18A is discussed as follows. Please note some process steps are essentially the same as the embodiment illustrated in FIGS. 5 through 10, and thus are not repeated herein. First, as shown in FIG. 19A, varactor 160 is formed. For simplicity, the details of varactor 160 are not shown.

Figure 19B:
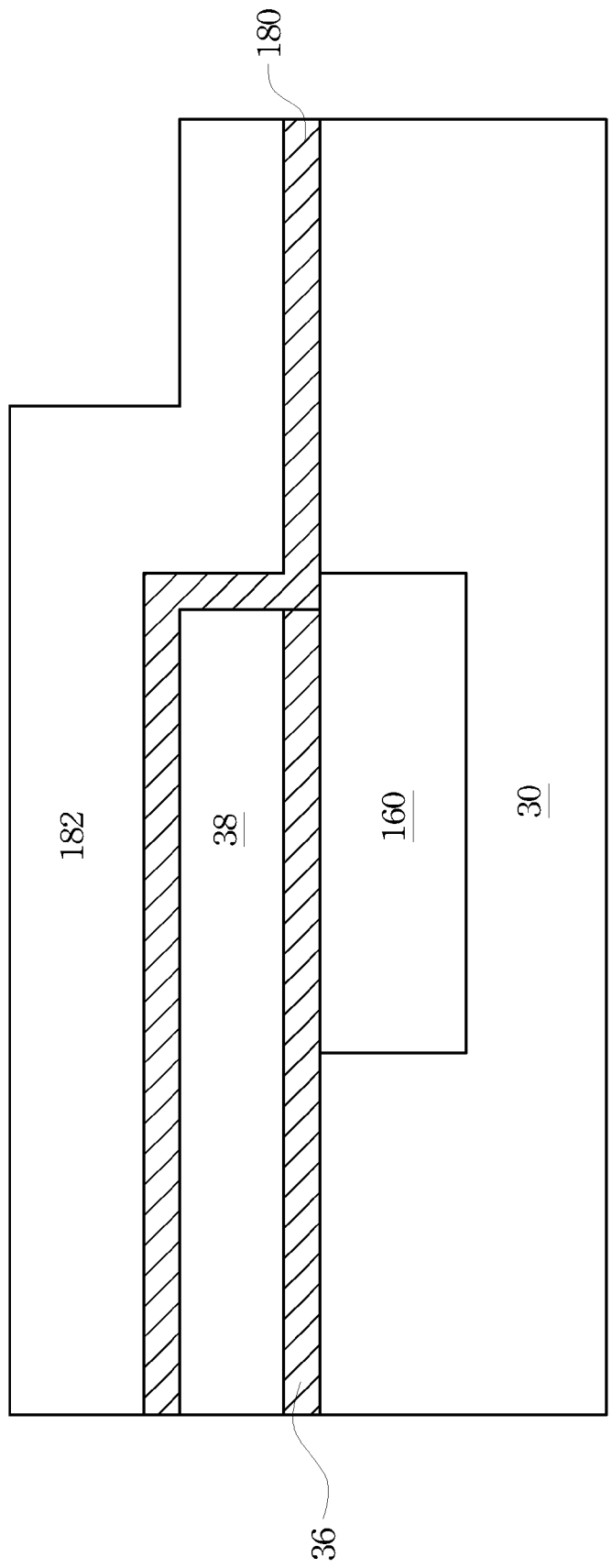

Next, gate dielectric layer 36 and gate electrode layer 38 are blanket formed, followed by the formation of insulating layer 180 and top conductive layer 182. Gate dielectric layer 36 and gate electrode layer 38 include essentially the same materials as discussed in the first embodiment (refer to FIG. 5). FIG. 19B illustrates an alternative embodiment, wherein gate dielectric layer 36 and gate electrode layer 38 are removed from one of the NMOS and PMOS region. In the following discussion, it is assumed that gate dielectric layer 36 and gate electrode layer 38 are removed from an NMOS device region. Insulating layer 180 and top conductive layer 182, which are formed of materials suitable for a PMOS device, are then blanket formed. Insulating layer 180 is preferably formed of high-k dielectric materials having k values higher than about 3.9, and may include metal oxides such as $AlLaO_3$, $HfAlO_3$, $HfO_2$, $Ta_2O_5$, $Al_2O_3$, $ZrO_2$, $TiO_2$, $SrTiO_3$, and combinations thereof. Gate dielectric layers 36 and insulating layer 180 may include same or different materials.

Figure 20:
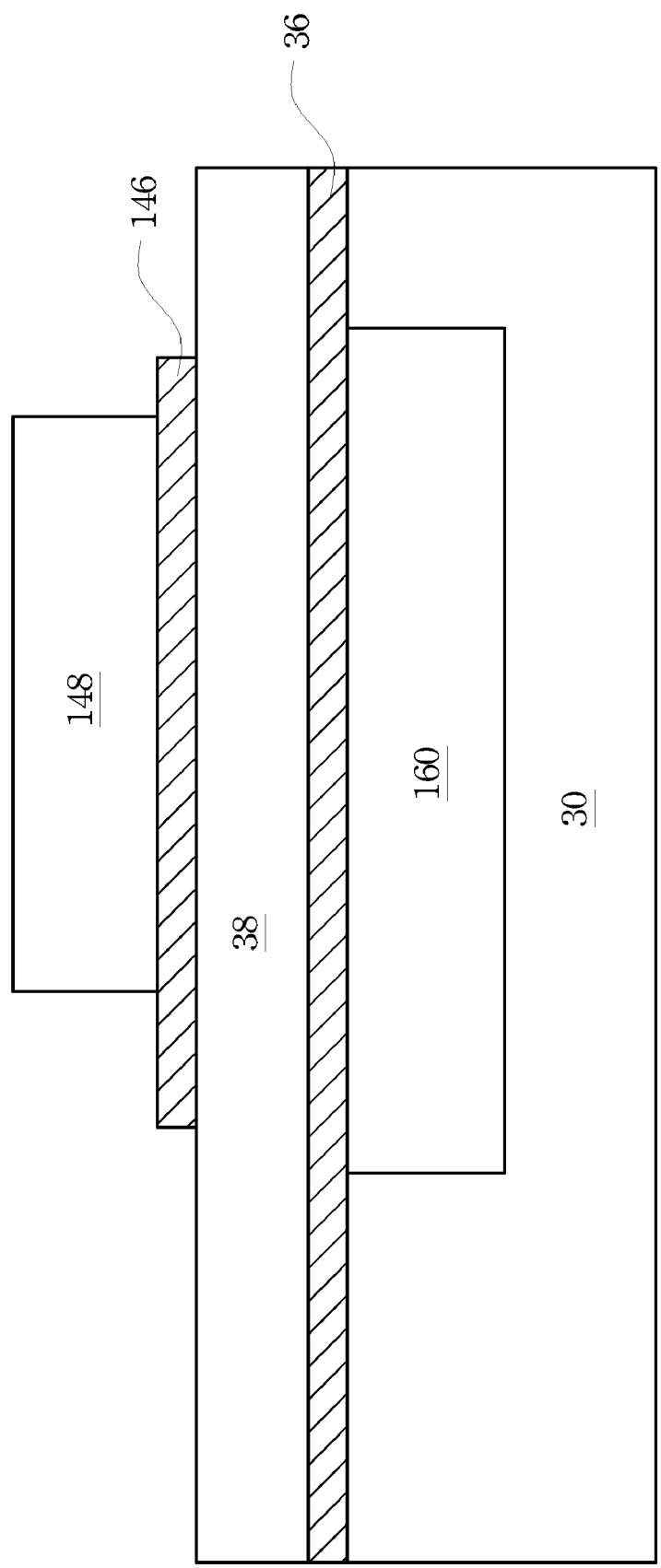
Figure 21:
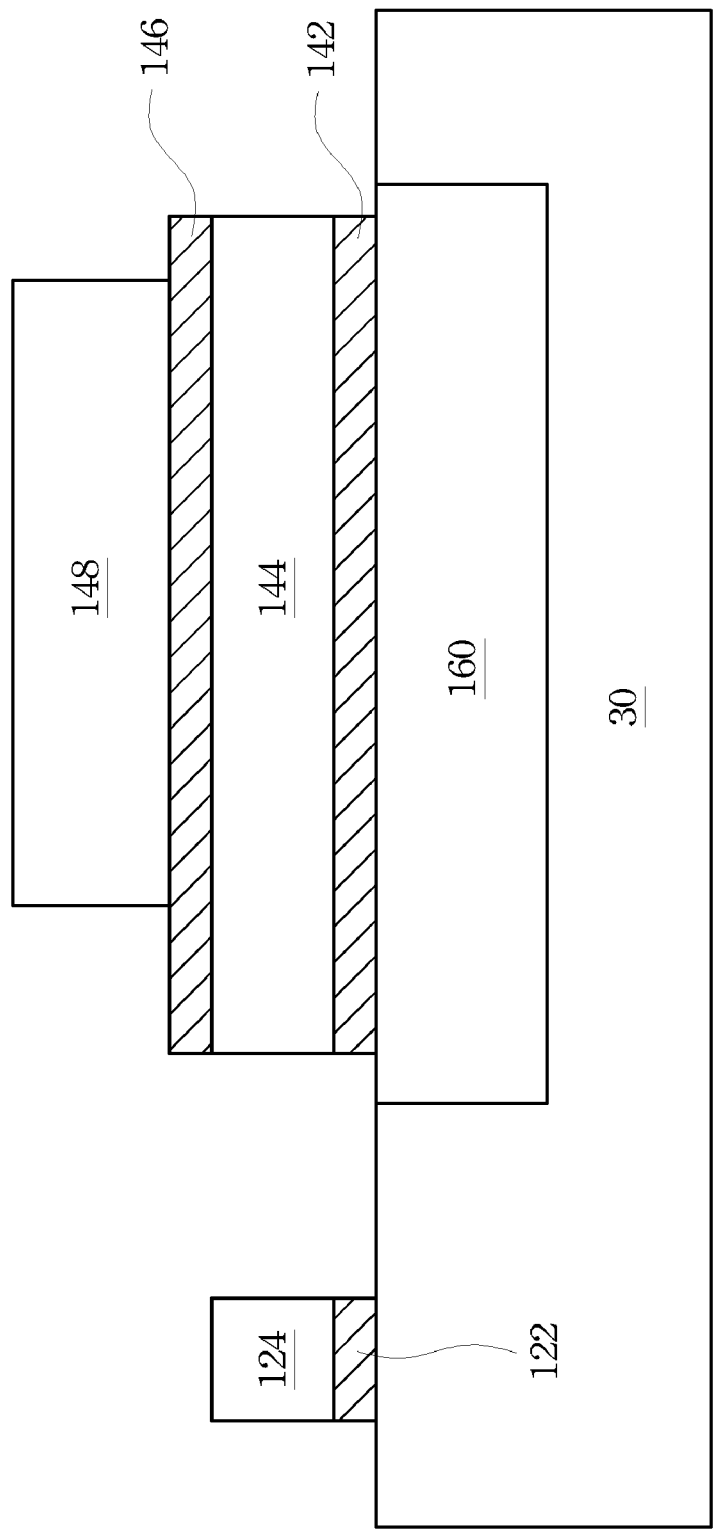

Referring to FIG. 20, a patterning is performed on conductive layer 182 and insulating layer 180. As a result, top plate 148 and insulating layer 146 are formed. In an embodiment wherein the patterning is performed on the structure shown in FIG. 19B, gate electrode 120' and dielectric layer 122' (refer to FIG. 17) are also formed. FIG. 21 illustrate the patterning of gate dielectric layer 36 and gate electrode layer 38 to form gate dielectric 122 and dielectric layer 142, and gate electrode 124, and bottom plate 144, respectively. In subsequent processes, ESL 130, contacts 152 and 154, and MOM capacitor 141 (refer to FIG. 18A) are formed. One skilled in the art will realize corresponding process steps by applying the teaching provided in preceding paragraphs.

Figure 22:
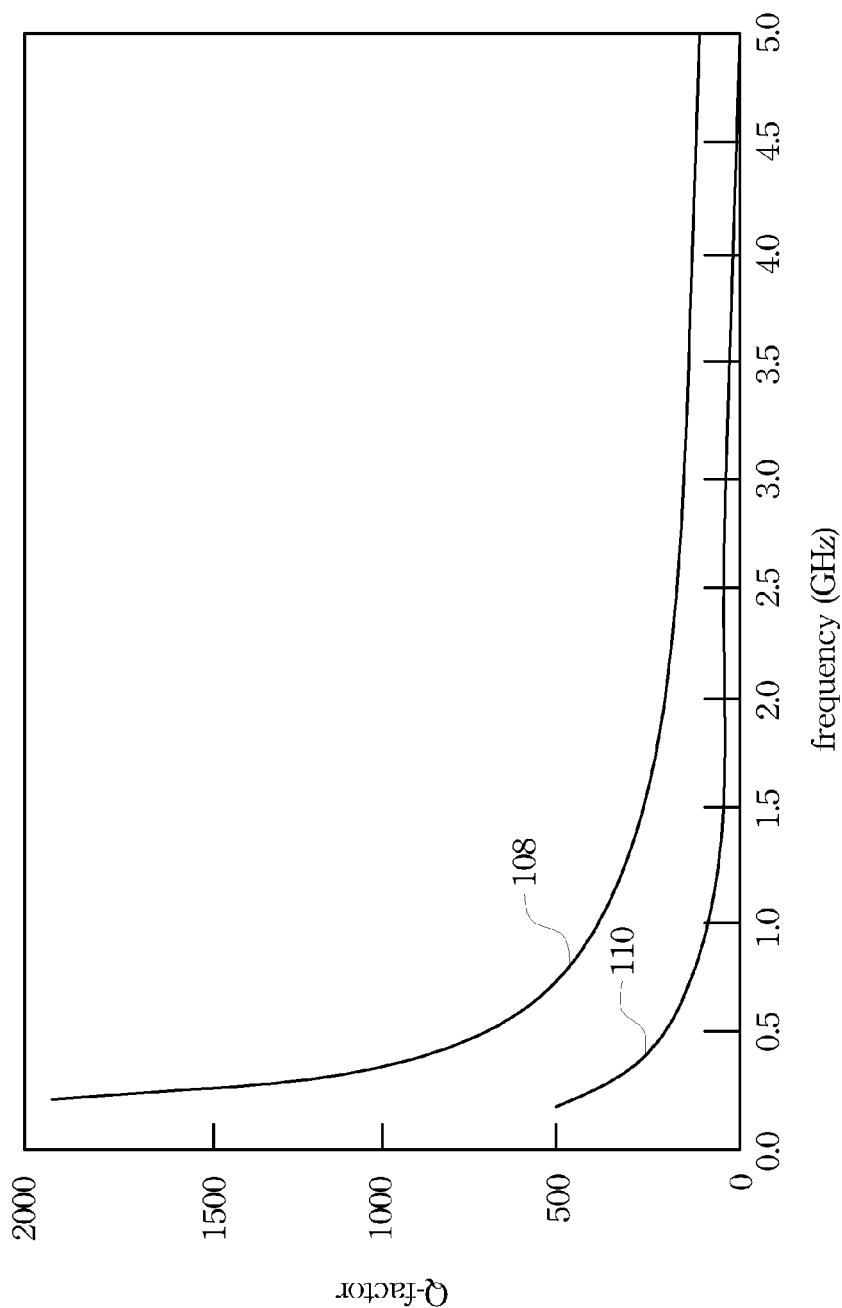
FIG. 22 illustrates simulation results, wherein Q-factors are shown as functions of frequencies.

Simulations results have revealed that the embodiments of the present invention have the same capacitances as the conventional capacitors having polysilicon bottom layers. However, the high-frequency response of the embodiments of the present invention is improved over the conventional capacitor. FIG. 22 illustrates Q-factors of capacitors as functions of frequencies. A first simulation sample simulates a first MOM capacitor having four layers, all formed of metals. A second sample simulates a second MOM capacitor having four layers, wherein the bottom layer of the second MOM capacitor is formed of polysilicon, which has a resistivity 100 times as great as the upper three layers. Line 108 illustrates the Q-factor of the first sample, and line 110 illustrates the Q-factor of the second sample. The simulation results have shown that at 2.4 GHz, the Q-factor of the second sample is degraded by about 74% than the first sample.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
    a substrate;
    a capacitor over the substrate, the capacitor comprising:
        a first layer comprising a first capacitor electrode and a second capacitor electrode, wherein the first capacitor electrode is formed of a metal-containing material free from polysilicon; and
    a MOS device comprising:
        a gate dielectric over the substrate; and
        a metal-containing gate electrode on the gate dielectric, wherein the metal-containing gate electrode is formed of a same material, and at a same level, as the first capacitor electrode.

2. The semiconductor structure of claim 1, wherein the capacitor is a metal-oxide-metal (MOM) capacitor further comprising a second layer, and wherein the second layer is over the first layer and in a bottom metallization layer, the second layer comprising:
    a third capacitor electrode and a fourth capacitor electrode, wherein the third and the fourth capacitor electrodes are insulated from each other;
    a first contact plug electrically connecting the first and the third capacitor electrodes; and
    a second contact plug electrically connecting the second and the fourth capacitor electrodes.

3. The semiconductor structure of claim 1 further comprising:
    a dielectric layer separating the first and the second capacitor electrodes from the substrate, wherein the dielectric layer is formed of a same material, and has a same thickness, as the gate dielectric of the MOS device.

4. The semiconductor structure of claim 1, wherein each of the first and the second capacitor electrodes comprises a bus and a plurality of fingers, wherein the fingers of the first and the second capacitor electrodes are parallel to each other and are placed in an alternating pattern.

5. The semiconductor structure of claim 1, wherein the capacitor is a MOM capacitor, and wherein the semiconductor structure further comprises:
    a PMOS device comprising a first gate electrode over the substrate; and
    an NMOS device comprising a second gate electrode over the substrate, wherein the first and the second capacitor electrodes each comprise a first sub layer and a second sub layer, and wherein the first sub layer is formed of a same material, and has a substantially same thickness, as the first gate electrode, and wherein the second sub layer is formed of a same material, and has a substantially same thickness, as the second gate electrode.

6. The semiconductor structure of claim 1, wherein the capacitor is substantially directly over a shallow trench isolation region in the substrate.

7. The semiconductor structure of claim 1, wherein the capacitor is substantially directly over a well region in the substrate.

8. The semiconductor structure of claim 1, wherein the capacitor is a metal-insulator-metal (MIM) capacitor comprising an insulating layer, and wherein the semiconductor structure further comprises:
    a PMOS device comprising a first gate electrode over the substrate; and
    an NMOS device comprising a second gate electrode over the substrate, wherein the first and the second capacitor electrodes are formed a same material, and has a substantially same thickness, as one of the first and the second gate electrodes.

9. The semiconductor structure of claim 8, wherein an insulating layer between the first and the second capacitor electrodes is formed of a same material, and has a substantially same thickness, as a gate dielectric underlying one of the first and the second gate electrodes.

10. A semiconductor structure comprising:
    a substrate;
    a metal-oxide-semiconductor (MOM) capacitor over the substrate, the MOM capacitor comprising:
        a first layer comprising a first capacitor electrode and a second capacitor electrode, each of the first and the second capacitor electrodes comprising a bus and a plurality of fingers, wherein the fingers of the first and the second capacitor electrodes are parallel to each other and are placed in an alternating pattern, and wherein the first and the second capacitor electrodes are metal features;
        a second layer in a bottom metallization layer and over the first layer, the second layer comprising a third capacitor electrode and a fourth capacitor electrode, wherein the third and the fourth capacitor electrodes are insulated from each other;
        a first contact plug electrically connecting the first and the third capacitor electrodes;
        a second contact plug electrically connecting the second and the fourth capacitor electrodes; and
    a MOS device comprising:
        a gate dielectric over the substrate; and
        a gate electrode on the gate dielectric, wherein the gate electrode is formed of a same material, and at a same level, as the first and the second capacitor electrodes, and wherein the gate electrode comprises metal and is free from polysilicon.

11. The semiconductor structure of claim 10, wherein each of the third and the fourth capacitor electrodes comprises a bus and a plurality of fingers, and wherein the fingers of the third and the fourth capacitor electrodes are parallel to each other in a direction perpendicular to a direction of the fingers of the first and the second capacitor electrodes, and are placed in an alternating pattern.

12. The semiconductor structure of claim 10, wherein the first and the second contact plugs comprise tungsten, and wherein the third and the fourth capacitor electrodes comprise copper.

13. The semiconductor structure of claim 10 further comprising spacers on sidewalls of the first and the second capacitor electrodes, wherein the MOS device further comprises a gate spacer on a sidewall of the gate electrode, and wherein the spacers and the gate spacer are formed of same materials.

14. The semiconductor structure of claim 10, wherein the first layer comprises:
a PMOS device comprising:
   a first gate dielectric over the substrate; and
   a first gate electrode on the first gate dielectric;
an NMOS device comprising:
   a second gate dielectric over the substrate; and
   a second gate electrode on the second gate dielectric; and
wherein the first layer of the MOM capacitor comprises a first and a second sub layer physically connected to each other, and wherein the first sub layer is formed of a same material, and has a substantially same thickness, as the first gate electrode.

* * * * *